(12) United States Patent
Takahashi

(10) Patent No.: US 8,828,880 B2
(45) Date of Patent: Sep. 9, 2014

(54) METHOD AND APPARATUS FOR MANUFACTURING SEMICONDUCTOR DEVICE

(75) Inventor: Hiroyuki Takahashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/884,816

(22) PCT Filed: Nov. 10, 2011

(86) PCT No.: PCT/JP2011/075942
§ 371 (c)(1),
(2), (4) Date: May 13, 2013

(87) PCT Pub. No.: WO2012/063901
PCT Pub. Date: May 18, 2012

(65) Prior Publication Data
US 2013/0237061 A1    Sep. 12, 2013

(30) Foreign Application Priority Data

Nov. 11, 2010  (JP) .................................. 2010-252465

(51) Int. Cl.
| | | |
|---|---|---|
| H01L 21/302 | (2006.01) | |
| H01L 21/461 | (2006.01) | |
| H01L 29/78 | (2006.01) | |
| H01L 21/311 | (2006.01) | |
| H01L 21/306 | (2006.01) | |

(52) U.S. Cl.
CPC ...... *H01L 21/30604* (2013.01); *H01L 29/7843* (2013.01); *H01L 29/78* (2013.01); *H01L 21/31116* (2013.01)
USPC .............................. 438/706; 438/724; 216/79

(58) Field of Classification Search
USPC ..................... 438/706, 710, 714, 724; 216/79
See application file for complete search history.

(56) References Cited

U.S. PATENT DOCUMENTS 7,872,316 B2    1/2011 Iwata

FOREIGN PATENT DOCUMENTS

JP    2008 288364    11/2008

OTHER PUBLICATIONS

International Search Report Issued Feb. 14, 2012 in PCT/JP11/75942 Filed Nov. 10, 2011.

*Primary Examiner* — Roberts Culbert
(74) *Attorney, Agent, or Firm* — Oblon, Spivak, McClelland, Maier & Neustadt, L.L.P.

(57) ABSTRACT

A method for manufacturing a semiconductor device by etching a SiN film on a surface of a substrate by using a gas containing a halogen element includes supplying a gas containing a basic gas at the initial stage of a process for supplying the gas containing the halogen element to the surface of the SiN film. By supplying the gas containing the basic gas at the initial stage of the etching, a SiNO film covering the surface of the SiN film is changed to a film of reaction products mainly including water ($H_2O$) and ammonium hexafluorosilicate (($NH_4$)$_2SiF_6$).

9 Claims, 6 Drawing Sheets

| STEP | 1 | 2 | 3 | 4 | 5 | 6 |
|---|---|---|---|---|---|---|
| PROCESSING TIME | 2 | 10 sec | 10 sec | 2 min | 5 sec | 1 min |
| PRESSURE (mT) | 3000 | 600 | 600 | 3000 | 0 | 0 |
| N₂ (sccm) | 1700 | 0 | 0 | 600 | 1700 | 0 |
| NH₃ (sccm) | 0 | 160 | 160 | 0 | 0 | 0 |
| HF (sccm) | 0 | 0 | 160 | 450 | 0 | 0 |
| Ar (sccm) | 300 | 280 | 120 | 0 | 300 | 0 |

METHOD AND APPARATUS FOR MANUFACTURING SEMICONDUCTOR DEVICE

FIELD OF THE INVENTION

The present invention relates to a method and an apparatus for manufacturing a semiconductor device.

BACKGROUND OF THE INVENTION

In relation to a transistor structure of a semiconductor device, a further reduction in the microscopic size of an insulated gate type field effect transistor (e.g., MOSFET) using a silicon oxide film has been advanced. As for a technique for improving performance of an N-type MOS transistor as well as a P-type MOS transistor in the field effect transistor, there has been proposed a dual stress liner (DSL) technique (see, Patent Document 1). In the DSL technique, a SiN (silicon nitride) film having a tensile stress is formed over a region where the N-type MOS transistor is formed, to thereby exert a tensile stress on that region, and a SiN film having a compressive stress is formed over a region where the P-type MOS transistor is formed, to thereby exert a compressive stress on that region.

As shown in FIG. 1, a plurality of transistors 103, each including a gate electrode 101 and sidewalls 102 formed on side surfaces of the gate electrode 101, is provided on a surface of an Si semiconductor wafer (hereinafter, referred to as "wafer"). As shown in FIG. 2, a SiN film 104 is formed by a CVD method or the like so as to cover the transistors 103. Next, the SiN film 104 is etched to have a desired thickness as shown in FIG. 3. The SiN film 104 having a desired thickness serves as a stress film for exerting a stress on the region where the transistors 103 are formed. Due to the presence of the SiN film 104, a tensile stress or a compressive stress can be exerted on the region where the transistors 103 are formed.

As for a method for etching a SiN film, a reactive ion etching (RIE) or a plasma etching is widely used. However, the RIE or the plasma etching may inflict damages on a film other than the SiN film on the wafer.

Patent Document 1: Japanese Patent Application Publication No. 2008-288364

Therefore, the present inventor has found, as a method for forming a SiN film having a desired thickness with less damages by precisely controlling an etching amount, a method for etching a SiN film, which serves as a stress film of strained transistors, with high precision by using a gas containing a halogen element such as a hydrogen fluoride gas or the like. In accordance with the method for etching the SiN film by using the gas containing the halogen element, an etching amount can be easily controlled and a SiN film having a desired thickness can be obtained. Further, since the etching is performed by chemical reaction with the SiN film, physical damages caused by a plasma on a film other than the SiN film may be reduced.

However, the present inventor has discovered from the various experiments that the method for etching the SiN film by using the gas containing the halogen element is disadvantageous in that an etching amount is decreased compared to the RIE or the plasma etching and also in that an etching amount distribution is non-uniform in the surface of the wafer. If the etching amount distribution is non-uniform, characteristics of the respective transistors are changed.

SUMMARY OF THE INVENTION

In view of the above, the present invention provides a method and an apparatus for manufacturing a semiconductor device which are capable of efficiently etching a SiN film while using a gas containing a halogen element.

The present inventor has examined causes of decrease in an etching amount or non-uniformity in an etching amount in a surface of a wafer in the case of etching a SiN (silicon nitride) film formed on the surface of the wafer by using a gas containing a halogen element such as a hydrogen fluoride gas or the like. As a result, the present inventor has found that the oxidation of the surface of the SiN film affects the decrease in the etching amount or the non-uniform in the etching amount.

In other words, it was expected when a surface of a SiN film 104 formed on a surface of a wafer W is oxidized by the atmosphere or the like, the surface of the SiN film 104 is covered by a film 105 made of SiNO (silicon oxynitride) and, thus, a gas containing a halogen element 106 cannot sufficiently pass through the SiNO film 105, as shown in FIG. 4.

When the surface of the SiN film 104 is covered with the SiNO film 105, the gas containing the halogen element 106 serving as an etching gas substantially (efficiently) does not reach the SiN film 104. As a result, the SiN film 104 cannot be effectively etched. Further, since the SiNO film 105 has been oxidized by the atmosphere, it is very likely that the film thickness is non-uniform in the surface of the wafer. When the film thickness of the SiNO film 105 is non-uniform in the surface of the wafer, the gas containing the halogen element 106 does not reach the SiN film 104 at, e.g., a portion where the SiNO film 105 is thick and, thus, the SiN film 104 at that portion cannot be etched. On the other hand, at a portion where the SiNO film 105 is thin, a comparatively large amount of the gas containing the halogen element 106 reaches the SiN film 104. Therefore, the etching amount of the SiN film 104 at the thin portion becomes larger than that at the thick portion.

Accordingly, the ease of penetration of the gas containing the halogen element 106 varies in the surface of the wafer, so that the etching amount of the SiN film 104 in the surface of the wafer becomes non-uniform. The SiNO film is a kind of a native oxide film that can be obtained while the wafer W having the SiN film 104 formed thereon by a CVD apparatus is being transferred. In the conventional RIE or plasma etching, the SiNO film 105 was etched together with the SiN film 104, so that the above-described problems may not occur.

Therefore, in the present invention, the etching process of the SiN film 104 by using a gas containing a halogen element is divided into two steps including at least a step of supplying a gas containing a basic gas such as an ammonia gas at an initial stage of the etching process. Accordingly, the SiNO film 105 covering the surface of the SiN film 104 is changed to a film 105' of a reaction product mainly containing ammonium hexafluorosilicate (($NH_4$)$_2$$SiF_6$) and water ($H_2O$). The reaction product film 105' can allow the gas containing the halogen element 106 to pass therethrough, as shown in FIG. 5. As a result, the gas containing the halogen element serving as an etching gas reaches the SiN film 104 and efficiently etches the SiN film 104 with excellent in-plane uniformity.

In accordance with an aspect of the present invention, there is provided a method for manufacturing a semiconductor device by etching a SiN film on a surface of a substrate by using a gas containing a halogen element, the method including: supplying the gas containing the halogen element to the surface of the SiN film, wherein a gas containing a basic gas is supplied at an initial stage of said supplying the gas containing the halogen element.

In accordance with another aspect of the present invention, there is provided an apparatus for manufacturing a semiconductor device by etching a SiN film formed on a surface of a substrate accommodated in a processing chamber, the apparatus including: a gas supply mechanism configured to supply a gas containing a halogen element and a gas containing a basic gas into the processing chamber; and a control unit configured to control the gas supply mechanism. Further, under the control of the control unit, the gas containing the basic gas is supplied at an initial stage of a process for supplying the gas containing the halogen element to the surface of the SiN film in the processing chamber.

EFFECT OF THE INVENTION

In accordance with the present invention, a SiN film can be efficiently etched while using a gas containing a halogen element, and a throughput is improved. Due to this etching process using the gas containing the halogen element, a SiN film having a desired thickness with less damages can be obtained, and a stress film for exerting a stress is formed on, e.g., a region on a surface of a substrate where transistors are formed.

DETAILED DESCRIPTION OF THE EMBODIMENTS

Figure 1:
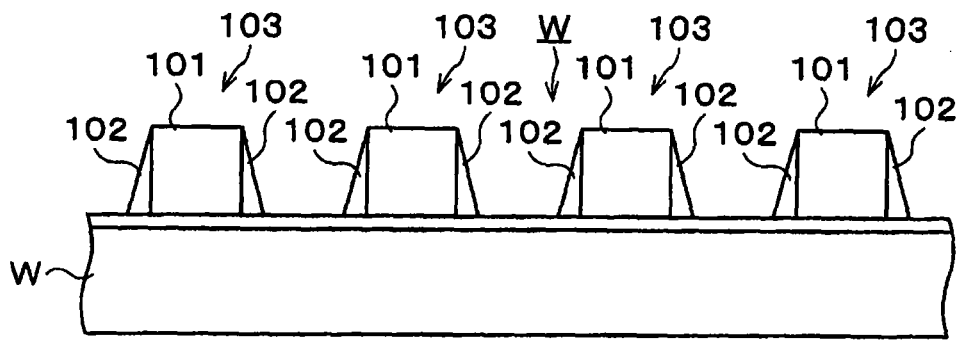
FIG. 1 is a partial vertical cross sectional view showing a schematic structure of a wafer having on a surface thereof a plurality of transistors.

Hereinafter, an example of an embodiment of the present invention will be described. Further, throughout this specification and the drawings, like reference numerals will be given to like parts having substantially identical functions, and redundant description thereof will be omitted.

Figure 6:
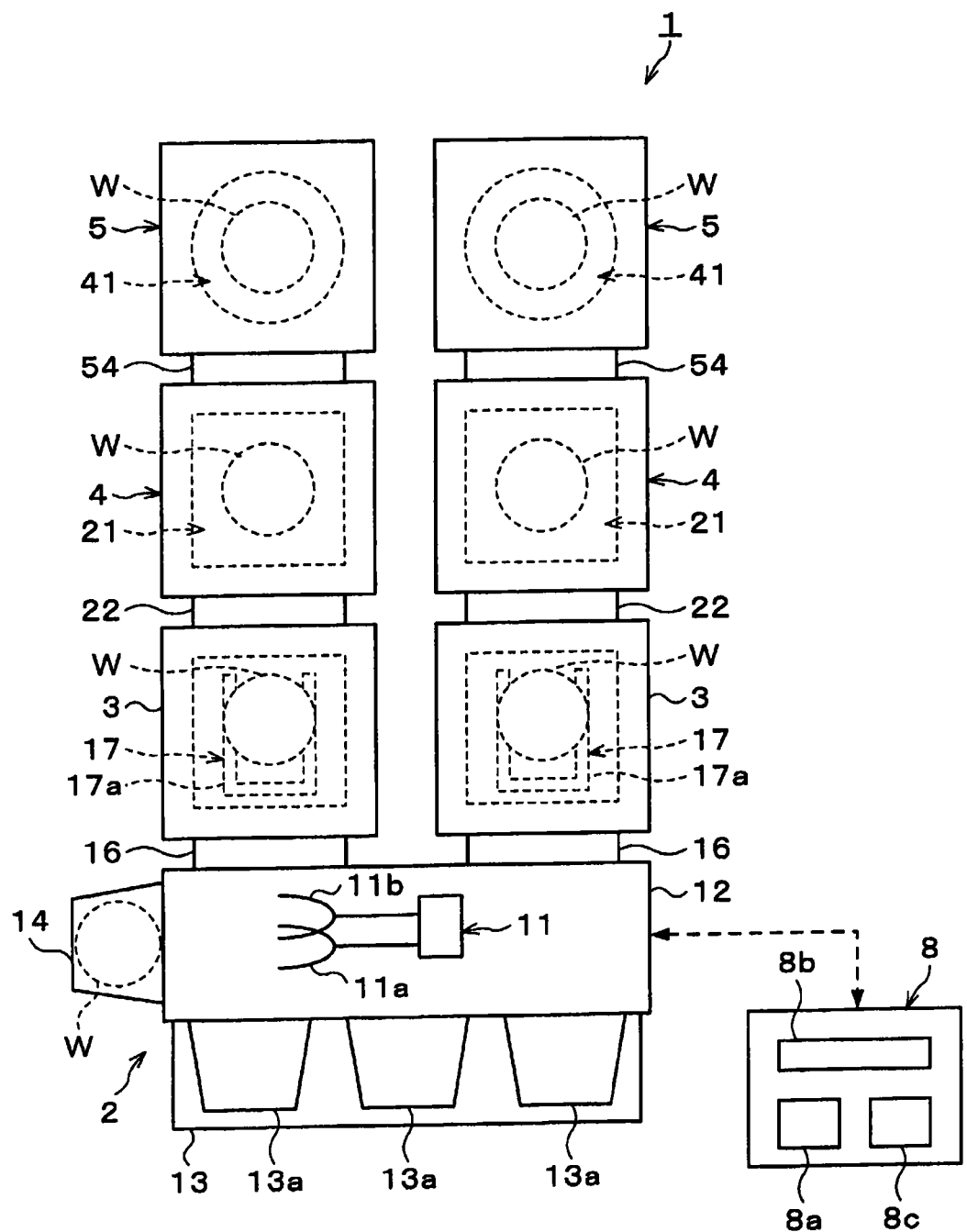
FIG. 6 is a schematic top view of a semiconductor device manufacturing apparatus.

As shown in FIG. 6, a semiconductor device manufacturing apparatus 1 includes: a loading/unloading port 2 for loading/unloading a wafer W into/from the semiconductor device manufacturing apparatus 1; two load-lock chambers 3 disposed adjacent to the loading/unloading port 2; PHT processing apparatuses 4, respectively disposed adjacent to the load-lock chambers 3, each for performing a PHT (Post Heat Treatment) process as a heating process; etching apparatuses 5, respectively disposed adjacent to the PHT processing apparatuses 4, each for performing an etching process; and a control computer (control unit) 8 configured to provide control commands to the respective units of the semiconductor device manufacturing apparatus 1. The PHT apparatus 4 and the etching apparatus 5 correspondingly connected with each of the load-lock chambers 3 are linearly arranged sequentially in this order from the corresponding load-lock chamber 3.

In the loading/unloading port 2, a transfer chamber 12 in which a first wafer transfer unit 11 for transferring a wafer having, e.g., an approximately disc shape, is provided. The wafer transfer unit 11 has two transfer arms 11a and 11b each for substantially horizontally holding the wafer W. Provided at one side of the transfer chamber 12 are, e.g., three mounting tables 13 for mounting thereon carriers 13a capable of accommodating therein a plurality of wafers W in multiple stages. Further, an orienter 14 is installed to align the wafer W by optically calculating an eccentric amount while rotating the wafer W.

In this loading/unloading port 2, the wafer W, held by each of the transfer arms 11a and 11b, is transferred to a desired location while being rotated, moved linearly or lifted up/down within a substantially horizontal plane by the operation of the wafer transfer unit 11. Further, the wafer W is loaded and unloaded by allowing each of the transfer arms 11a and 11b to enter into and retreat from the corresponding carrier 13a on the mounting table 13, the orienter 14, and the load-lock chamber 3.

The load-lock chambers 3 are connected to the transfer chamber 12 through respective gate valves 16. A second wafer transfer unit 17 for transferring a wafer W is provided in each of the load-lock chambers 3. The wafer transfer unit 17 has a transfer arm 17a for substantially horizontally holding the wafer W. The inside of the load-lock chambers 3 can be exhausted to a vacuum level.

In each of the load-lock chambers 3, the wafer W held by the transfer arm 17a is transferred while being rotated, moved linearly or lifted up/down within a substantially horizontal plane by the operation of the wafer transfer unit 17. Then, the wafer W is loaded into and unloaded from the PHT processing apparatus 4 coupled to the corresponding load-lock chamber 3 in series by allowing the transfer arm 17a to enter into and retreat from the PHT processing apparatus 4. Further, the wafer W is loaded into and unloaded from the etching apparatus 5 through the corresponding PHT processing apparatus 4 by allowing the transfer arm 17a to enter into and retreat from the etching apparatus 5.

Each of the PHT processing apparatuses 4 includes a hermetically sealed processing chamber (processing space) 21 for accommodating therein a wafer W. Further, there are provided a loading/unloading port (not shown) for loading/unloading a wafer W into/from the processing chamber and a gate valve 22 for opening/closing the loading/unloading port. The processing chambers 21 are connected to the load-lock chambers 3 through the gate valves 22, respectively.

Figure 7:
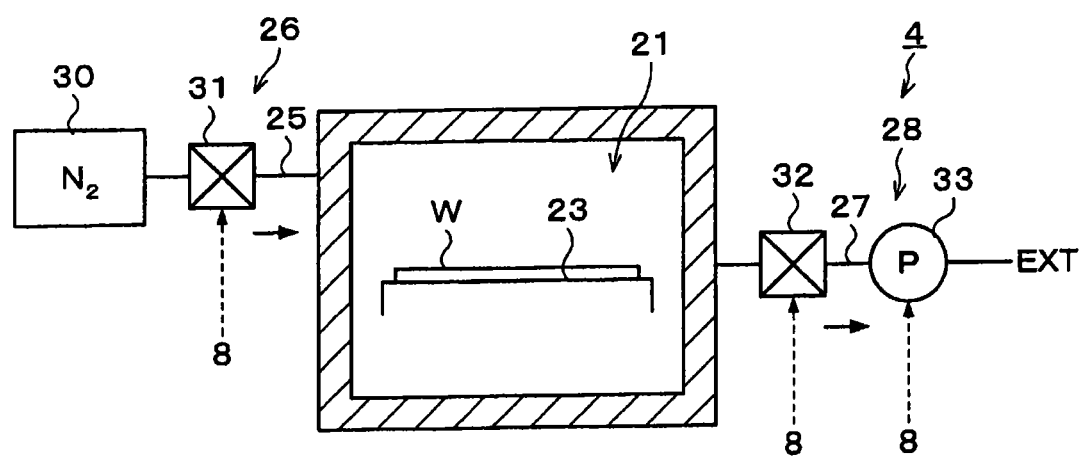
FIG. 7 explains a configuration of a PHT processing apparatus.

As shown in FIG. 7, a mounting table 23 for substantially horizontally mounting thereon a wafer W is provided in the processing chamber 21 of each of the PHT processing apparatuses 4. Further, there are provided a gas supply mechanism 26 for heating and supplying an inert gas, e.g., a nitrogen gas ($N_2$) or the like, to the processing chamber 21 through a supply line 25, and a gas exhaust mechanism 28 for exhausting the processing chamber 21 through an exhaust line 27. The supply line 25 is connected to a supply source 30 of the nitrogen gas. The supply line is provided with a flow rate control valve 31 for opening/closing the supply line 25 and adjusting a supply flow rate of the nitrogen gas. The exhaust line 27 is provided with an opening/closing valve 32 and an exhaust pump 33 for causing forced exhaustion.

The respective operations of the units such as the gate valve 22, the flow rate control valve 31, the opening/closing valve 32, the exhaust pump 33 and the like in each of the PHT processing apparatuses 4 are individually controlled under the control commands of the control computer 8. In other words, the supply of the nitrogen gas by the gas supply mechanism 26, the exhaust by the gas exhaust mechanism 28 and the like are controlled by the control computer 8.

Figure 8:
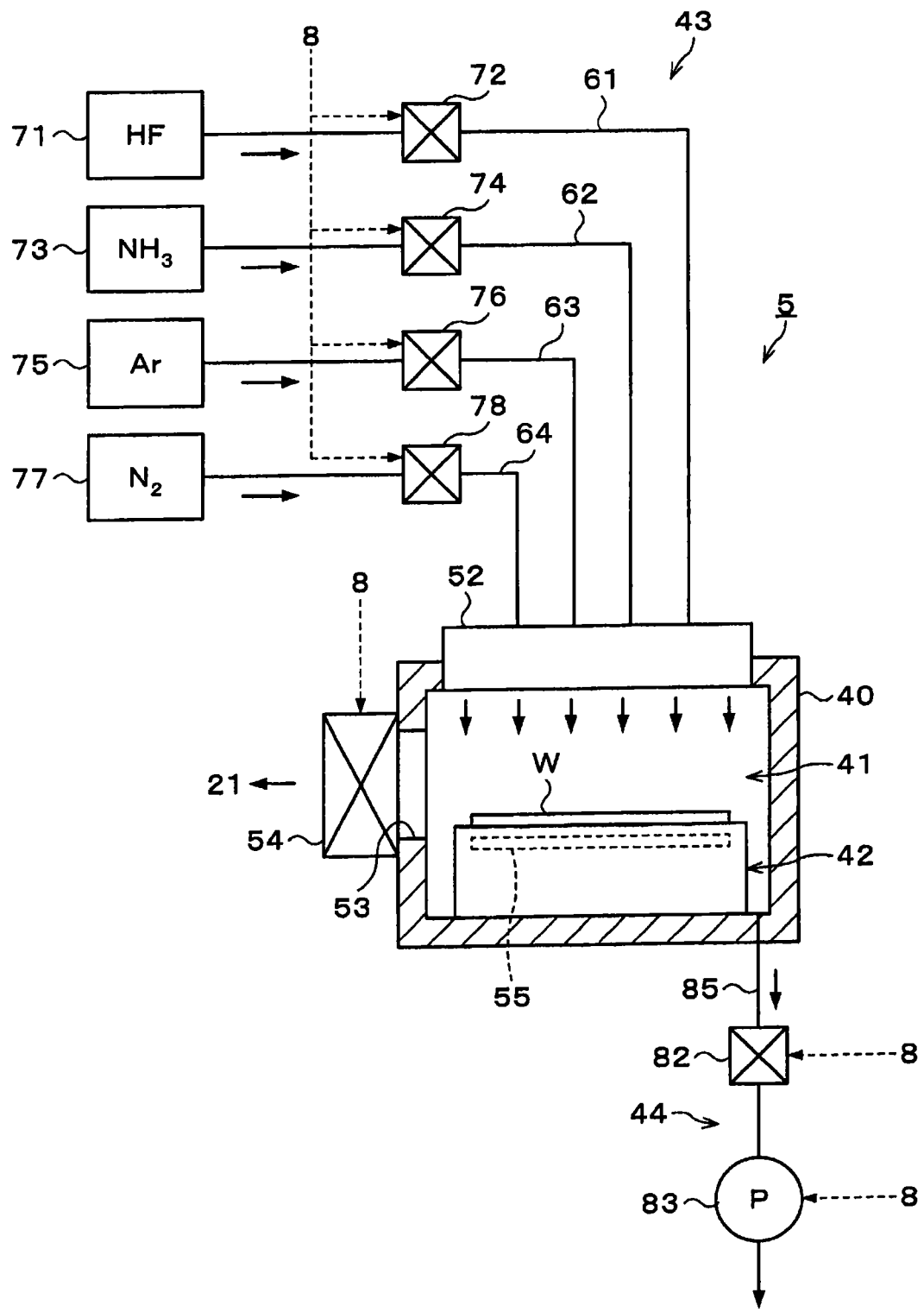
FIG. 8 explains a configuration of an etching apparatus.

As shown in FIG. 8, each of the etching apparatuses 5 includes a hermetically sealed chamber 40, and the inside of the chamber 40 serves as a processing chamber (processing space) 41 for accommodating therein a wafer W. Provided in the chamber 40 is a mounting table 42 for substantially horizontally mounting thereon the wafer W. Further, each of the etching apparatuses 5 includes a gas supply mechanism 43 for supplying gases into the processing chamber 41 and a gas exhaust mechanism 44 for exhausting the processing chamber 41.

Provided at a side wall portion of the chamber 40 are a loading/unloading port 53 for loading and unloading a wafer W into and from the processing chamber 41 and a gate valve 54 for opening/closing the loading/unloading port 53. The processing chamber 41 is connected to the processing chamber 21 of the PHT processing apparatus 4 through the gate valve 54. A shower head 52 having a plurality of gas injection openings for supplying a processing gas therethrough is provided at a ceiling portion of the chamber 40.

The mounting table 42 has a substantially circular shape when viewed from above and is secured to a bottom portion of the chamber 40. The mounting table 42 has therein a temperature controller 55 for controlling a temperature of the mounting table 42. The temperature controller 55 has a passageway through which liquid (e.g., water or the like) for use in temperature control is circulated. The temperature of the upper surface of the mounting table 42 is controlled by exchange of heat with the liquid flowing through the passageway. The temperature of the wafer W is controlled by exchange of heat between the mounting table 42 and the wafer W on the mounting table 42. The temperature controller 55 is not limited to the above-described one and may be, e.g., an electric heater for heating the mounting table 42 and the wafer W by using electric resistance heat, or the like.

The gas supply mechanism 43 includes: the above-described shower head 52; a hydrogen fluoride gas supply line 61 through which a hydrogen fluoride gas serving as a gas containing a halogen element is supplied into the processing chamber 41; an ammonia gas supply line 62 through which an ammonia gas serving as a gas containing a basic gas is supplied into the processing chamber 41; an argon gas supply line 63 through which an argon gas serving as an inert gas is supplied into the processing chamber 41; and a nitrogen gas supply line 64 through which a nitrogen gas serving as an inert gas is supplied into the processing chamber 41. The hydrogen fluoride gas supply line 61, the ammonia gas supply line 62, the argon gas supply line 63, and the nitrogen gas supply line 64 are connected to the shower head 52. The hydrogen fluoride gas, the ammonia gas, the argon gas, and/or the nitrogen gas are injected through the shower head 52 so as to be diffused into the processing chamber 41.

The hydrogen fluoride gas supply line 61 is connected to a hydrogen fluoride gas supply source 71. The hydrogen fluoride gas supply line 61 is provided with a flow rate control valve 72 for opening/closing the hydrogen fluoride gas supply line 61 and controlling a supply flow rate of the hydrogen fluoride gas. The ammonia gas supply line 62 is connected to an ammonia gas supply source 73. The ammonia gas supply line 62 is provided with a flow rate control valve 74 for opening/closing the ammonia gas supply line 62 and controlling a supply flow rate of the ammonia gas. The argon gas supply line 63 is connected to an argon gas supply source 75. The argon gas supply line 63 is provided with a flow rate control valve 76 for opening/closing the argon gas supply line 63 and controlling a supply flow rate of the argon gas. The nitrogen gas supply line 64 is connected to a nitrogen gas supply source 77. The nitrogen gas supply line 64 is provided with a flow rate control valve 78 for opening/closing the nitrogen gas supply line 64 and controlling a supply flow rate of the nitrogen gas.

The gas exhaust mechanism 44 includes an exhaust line 85 provided with an opening/closing valve 82 and an exhaust pump 83 for causing forcible exhaustion. One end of the exhaust line 85 is connected to an opening at a bottom portion of the chamber 40.

The respective operations of the units such as the gate valve 54, the temperature controller 55, the flow rate control valves 72, 74, 76 and 78, the opening/closing valve 82, the exhaust pump 83 and the like in each of the etching apparatuses 5 are individually controlled under the control commands of the control computer 8. In other words, the supplies of the hydrogen fluoride gas, the ammonia gas, the argon gas and the nitrogen gas by the gas supply mechanism 43, the exhaust by the gas exhaust mechanism 44, the temperature control by the temperature controller 55 and the like are controlled by the control computer 8.

The functional units of the semiconductor device manufacturing apparatus 1 are connected through signal lines to the control computer 8 which automatically controls the entire operation of the semiconductor device manufacturing apparatus 1. Here, the functional units refer to all units that operate to realize predetermined processing conditions, such as the wafer transfer unit 11, the wafer transfer unit 17, the gate valve 22, the flow rate control valve 31, and the exhaust pump 33 of each of the PHT processing apparatuses 4, the gate valve 54, the temperature controller 55, the flow rate control valves 72, 74, 76 and 78, the opening/closing valve 82 and the exhaust pump 83 of each of the etching apparatuses 5, and the like. The control computer 8 is typically a general-purpose computer capable of realizing an arbitrary function depending on software it executes.

As shown in FIG. 6, the control computer 8 includes: an operation unit 8a having a CPU (central processing unit); an input/output unit 8b connected to the operation unit 8a; and a storage medium 8c which is inserted in the input/output unit 8b to store a control software. The storage medium 8c stores therein the control software (program) for performing a predetermined substrate processing method to be described later on the semiconductor device manufacturing apparatus 1 when executed by the control computer 8. When the control software is executed by the control computer 8, the functional units of the semiconductor device manufacturing apparatus 1 are controlled such that various processing conditions (e.g., the pressure in the processing chamber 41 and the like) defined by a predetermined processing recipe are realized. In other words, as will be described later in detail, the control commands are given so that the etching method for performing the COR (Chemical Oxide Removal) process in the etching apparatus 5 and the PHT process in the PHT processing apparatus 4 in this order.

The storage medium 8c may be fixed to the control computer 8, or may be detachably installed to a reader (not shown) provided in the control computer 8 to be readable by the reader. As the most typical example, the storage medium 8c is a hard disk drive in which the control software is installed by a manufacturer of the semiconductor device manufacturing apparatus 1. As another example, the storage medium 8c is a removable disk such as a CD-ROM or a DVD-ROM in which the control software is written. Such a removable disk is read by an optical reader (not-shown) provided in the control computer 8. The storage medium 8c may be either of a RAM (random access memory) type or a ROM (read only memory) type. Further, the storage medium 8c may be a cassette-type ROM. In brief, any medium known in a computer technical field may be used as the storage medium 8c. In a factory where a plurality of semiconductor device manufacturing apparatuses 1 is arranged, the control software may be stored in a management computer for generally controlling the control computers 8 of the semiconductor device manufacturing apparatuses 1. In this case, each of the semiconductor device manufacturing apparatuses 1 is controlled by the management computer through a communications line so as to execute a predetermined process.

Figure 2:
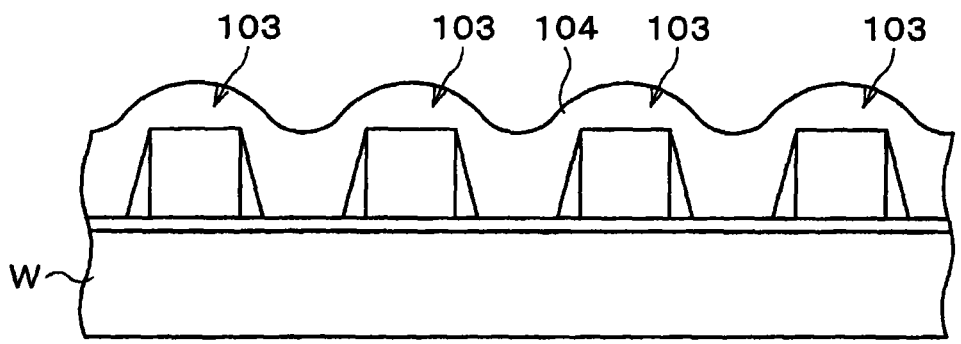
FIG. 2 is a partial vertical cross sectional view showing a schematic structure of a wafer having on a surface thereof a SiN film.

Hereinafter, a method for processing a wafer W in the semiconductor device manufacturing apparatus 1 configured as described above will be explained. First, a wafer W having a surface, on which a SiN (silicon nitride) film 104 is formed by, e.g., a CVD method as shown in FIG. 2, is accommodated in the carrier 13a and transferred to the semiconductor device manufacturing apparatus 1. As described in FIG. 1, a plurality of transistors 103, each including the gate electrode 101 and the sidewalls 102 formed at side surfaces of the gate electrode 101, is provided on the surface of the wafer W.

Figure 4:
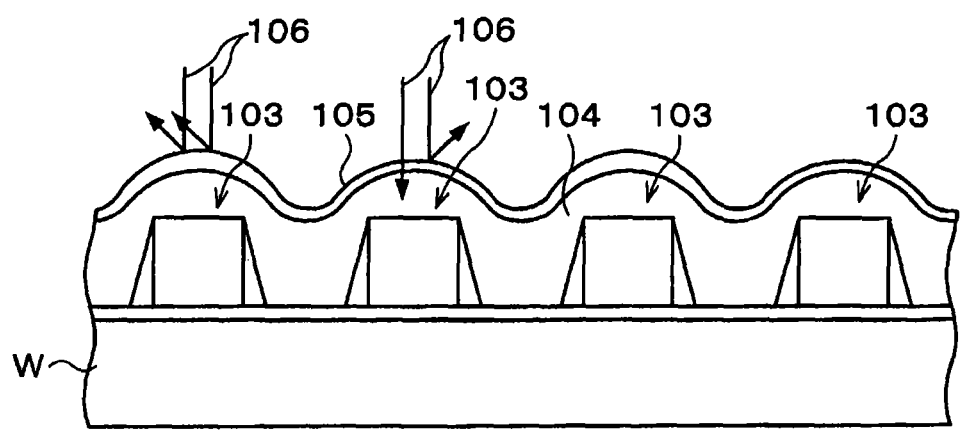
FIG. 4 explains a state where the surface of the SiN film formed on the surface of the wafer W is oxidized, so that a film made of SiNO covers the surface of the SiN film.

On the surface of the wafer W loaded into the semiconductor device manufacturing apparatus 1 after being accommodated in the carrier 13a, the SiN film 104 is formed in advance so as to cover the transistors 103 as shown in FIG. 2. Further, as described in FIG. 4, the surface of the SiN film 104 formed on the surface of the wafer W has been oxidized by the atmosphere or the like, so that it is covered by the SiNO (silicon oxynitride) film 105.

In the semiconductor device manufacturing apparatus 1, the carrier 13a accommodating therein a plurality of wafers W (wafers W on which the SiN films 104 are formed in advance) is mounted on the mounting table 13 as shown in FIG. 6. One of the wafers W is unloaded from the carrier 13a by the wafer transfer unit 11 and loaded into the load-lock chamber 3. After the wafer W is loaded into the load-lock chamber 3, the load-lock chamber 3 is hermetically sealed and depressurized. Next, the gate valves 22 and 54 are opened so that the load-lock chamber 3 communicates with the processing chamber 21 of the PHT processing apparatus 4 and the processing chamber 41 of the etching apparatus 5, wherein the processing chambers 21 and 41 have been depressurized to be lower than the atmospheric pressure. By using the wafer transfer unit 17, the wafer W can be unloaded from the load-lock chamber 3, linearly moved to pass through the loading/unloading port (not shown) of the processing chamber 21, the processing chamber 21 and the loading/unloading port 53 in this order, and then loaded into the processing chamber 41 of the etching apparatus 5.

In the processing chamber 41 of the etching apparatus 5, the wafer W is delivered onto the mounting table 42 by the transfer arm 17a of the wafer transfer unit 17 in a state where the surface where the SiN film 104 is formed (device formation surface) is facing upward. When the loading of the wafer W is completed, the transfer arm 17a retreats from the processing chamber 41. Then, the loading/unloading port 53 is closed to hermetically seal the processing chamber 41, and the etching process is started thereafter.

After the processing chamber 41 is hermetically sealed, the argon gas and the nitrogen gas are supplied respectively through the argon gas supply line 63 and the nitrogen gas supply line 64 into the processing chamber 41. The pressure in the processing chamber 41 becomes lower than the atmospheric pressure. The temperature of the wafer W on the mounting table 42 is controlled to be set at a predetermined target value by the temperature controller 55. In this case, the flow rate of the argon gas is set, e.g., in a range from about 0 sccm to about 2000 sccm, and the flow rate of the nitrogen gas is set, e.g., in a range from about 0 sccm to about 2000 sccm. The pressure in the processing chamber 41 is reduced to a low level, e.g., in a range from about 2000 mTorr to about 5000 mTorr (in a range from about 260 Pa to about 650 Pa). The temperature of the wafer W on the mounting table 42 is controlled to be set, e.g., in a range from about 50° C. to about 100° C.

After the pressure in the processing chamber 41 is reduced to the desired low level and the temperature of the wafer W is controlled to be set at the target value, a hydrogen fluoride gas is supplied through the hydrogen fluoride gas supply line 61 into the processing chamber 41 and the SiN film 104 formed on the surface of the wafer W is etched.

In this case, the surface of the SiN film 104 formed on the surface of the wafer W is oxidized by the atmosphere or the like and covered by the SiNO film 105 as described above. Therefore, as described in FIG. 4, even if the hydrogen fluoride gas 106 is supplied into the processing chamber 41, the hydrogen fluoride gas 106 cannot pass through the SiNO film 105. As a consequence, the hydrogen fluoride gas 106 serving as an etching gas does not substantially reach the SiN film 104, so that the SiN film 104 cannot be effectively etched.

In view of the above, an ammonia gas as a gas containing a basic gas is supplied through the ammonia gas supply line 62 into the processing chamber 41 at an initial stage of the etching process on the SiN film 104. Accordingly, at the initial stage of the etching process on the SiN film 104, an atmosphere in the processing chamber 41 is set to a processing atmosphere including a gaseous mixture of the hydrogen fluoride gas and the ammonia gas. By supplying the gaseous mixture of the hydrogen fluoride gas and the ammonia gas to the surface of the wafer W in the processing chamber 41 at the initial stage of the etching process on the SiN film 104, the SiNo film 105 covering the surface of the SiN film 104 is changed to a film 105' of a reaction product mainly including ammonium hexafluorosilicate (($NH_4)_2SiF_6$) and water ($H_2O$). A gas containing a halogen element can efficiently pass through the reaction product film 105' thus obtained. As a result, the hydrogen fluoride gas 106 serving as an etching gas can reach the SiN film 104 to thereby effectively etch the SiN film 104 as described in FIG. 5.

The initial stage of the etching process on the SiN film 104 (the stage in which an atmosphere in the processing chamber 41 is set to a processing atmosphere including a gaseous mixture of the hydrogen fluoride gas and the ammonia gas) is performed for, e.g., from about 5 to about 30 seconds. Further, at the initial stage of the etching process, the flow rate of the hydrogen fluoride gas is set, e.g., in a range from about 500 sccm to about 2000 sccm, and the flow rate of the ammonia gas is set, e.g., in a range from about 5 sccm to about 200 sccm. The pressure in the processing chamber 41 is reduced to a low level, e.g., in a range from about 100 mTorr to about 5000 mTorr (about 13 Pa to 650 Pa).

After the SiNO film 105 on the surface of the SiN film 104 is changed to the reaction product film 105', the supply of the ammonia gas through the ammonia gas supply line 62 is stopped. Meanwhile, the hydrogen fluoride gas through the hydrogen fluoride gas supply line 61 is continuously supplied. Accordingly, an atmosphere in the processing chamber 41 becomes an etching processing atmosphere including the hydrogen fluoride gas, and the etching of the SiN film 104 formed on the surface of the wafer W is performed. In this regard, it may be possible to etch the SiN film 104 even if the ammonia gas is continuously supplied. However, in order to etch merely the SiN film 104, it is preferable to stop the supply of the ammonia gas after the SiNO film 105 on the surface of the SiN film 104 is changed to the reaction product film 105'. This makes it possible to avoide the unnecessary use of the ammonia gas, and to minimize the adhesion of the reaction product of the ammonia gas and the hydrogen fluoride gas as deposits to the inner wall of the processing chamber 41.

Figure 5:
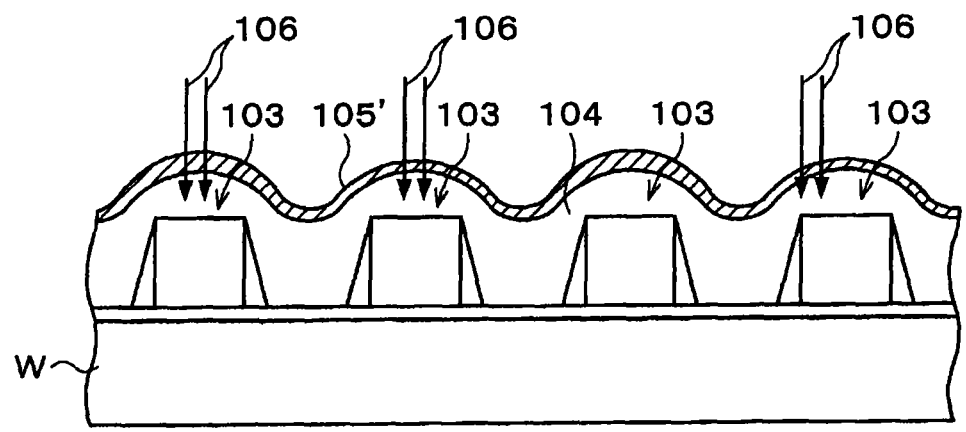
FIG. 5 explains a state where the film made of SiNO on the surface of the SiN film is changed to a film of a reaction product.

As described above, the SiNO film 105 on the surface of the SiN film 104 has been changed to the reaction product film 105' mainly containing ammonium hexafluorosilicate ($(NH_4)_2SiF_6$) and water ($H_2O$) at the initial stage. The present inventor has found from the experiment that the SiN film 104 can be sufficiently etched by the hydrogen fluoride gas 106 even when the reaction product film 105' remains on the surface of the SiN film 104. As shown in FIG. 5, the reaction product film 105' allows the hydrogen fluoride gas 106 to pass therethrough. As a result, the hydrogen fluoride gas 106 serving as an etching gas can reach the SiN film 104 to thereby efficiently etch the SiN film 104.

Further, as will be described in the following embodiment, the present inventor has found that when the etching is performed in a state where the reaction product film 105' remains on the surface of the SiN film 104, the etching rate is higher compared to when the etching is performed in a state where no reaction product film 105' remains on the surface of the SiN film 104. For example, the SiN film 104 may be etched by the hydrogen fluoride gas after the reaction product film 105' on the surface of the SiN film 104 is removed in the PHT processing apparatus 4. However, when the etching is performed in a state where the reaction product film 105' remains on the surface of the SiN film 104, the etching rate is higher and the throughput is considerably improved compared to when the SiN film 104 is etched in a state where the reaction product film 105' is removed. Further, by performing the etching in a state where the reaction product film 105' remains on the surface of the SiN film 104, a series of etching processes can be consecutively performed in the processing chamber 41 of the etching apparatus 5 without moving the wafer W to the PHT processing apparatus 4. This leads to further improvement in the throughput.

By effectively etching the SiN film 104 while using the hydrogen fluoride gas, the SiN film 104 can be rapidly etched to a desired thickness. Therefore, the SiN film 104 having a desired thickness can be obtained with less damage. Further, the hydrogen fluoride gas 106 can pass through the SiNO film 105 to reach the entire SiN film 104 uniformly. Accordingly, the SiN film 104 can be uniformly etched over the entire surface of the wafer W, and the SiN film 104 having a uniform film thickness can be formed on the entire surface of the wafer W. The SiN etched by the hydrogen fluoride gas is discharged through the exhaust line 85.

The etching process on the SiN film 104, in which the supply of the ammonia gas is stopped while the supply of the hydrogen fluoride gas is continued, is performed for, e.g., from about 30 seconds to about 300 seconds. The flow rate of the hydrogen fluoride gas is set, e.g., in a range from about 500 sccm to about 2000 sccm. The pressure in the processing chamber 41 is reduced to a low, e.g., in a range from about 100 mTorr to about 5000 mTorr (in a range from about 13 Pa to about 650 Pa).

When the etching process on the SiN film 104 formed on the surface of the wafer W is completed, the processing chamber 41 is forcibly exhausted and depressurized. Hence, the hydrogen fluoride gas is forcibly discharged from the processing chamber 41. Upon completion of the forcible exhaust of the processing chamber 41, the loading/unloading port 53 is opened. Then, the wafer W is unloaded from the processing chamber 41 of the etching apparatus 5 by the wafer transfer unit 17 and loaded into the processing chamber 21 of the PHT processing apparatus 4.

In the PHT processing apparatus 4, the wafer W is loaded into the processing chamber 21 with the surface where the etching process is performed is facing upward. After the wafer W is loaded, the transfer arm 17a retreats from the processing chamber 21, and the processing chamber 21 is hermetically sealed. Next, a heating process on the wafer W (PHT treatment process) is started. In this heating process, the processing chamber 21 is exhausted; a high-temperature heating gas is supplied into the processing chamber 21; and temperature in the processing chamber 21 is increased to a predetermined level. Accordingly, the reaction product film 105' remaining on the surface of the wafer W (the film 105' of the reaction product containing ammonium hexafluorosilicate ($(NH_4)_2SiF_6$) and water ($H_2O$)) is sublimated and removed from the surface of the wafer W.

The heating process on the wafer W is performed for from about 30 seconds to about 180 seconds while setting a temperature of the wafer W in a range from about 100° C. to about 300° C. The pressure in the processing chamber 21 is reduced to a low level, e.g., in a range from about 500 mTorr to about 2000 mTorr (in a range from about 65 Pa to about 260 Pa).

Upon completion of the heating process on the wafer W, the supply of the heating gas is stopped and the loading/unloading port of the PHT processing apparatus 4 is opened. Next, the wafer W is unloaded from the processing chamber 21 by the wafer transfer unit 17 and returned to the load-lock chamber 3.

Figure 3:
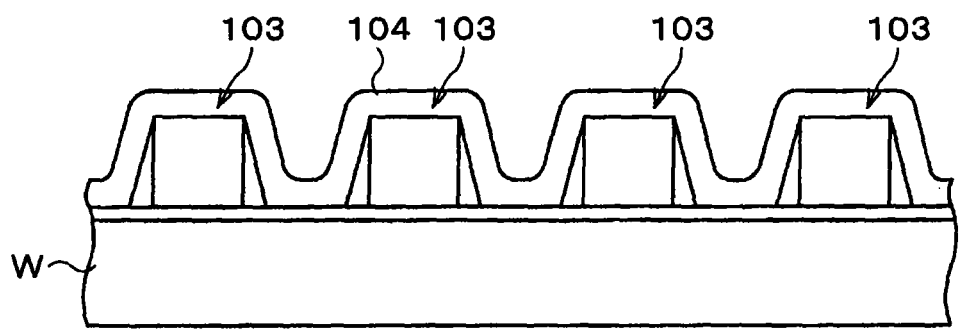
FIG. 3 is a partial vertical cross sectional view showing a schematic structure of a wafer having on a surface thereof a SiN film having a desired thickness by etching.

The wafer W having the SiN film 104 of a desired film thickness as described in FIG. 3 is returned to the load-lock chamber 3 and is hermetically sealed. Thereafter, the load-lock chamber 3 communicates with the transfer chamber 12. The wafer W is unloaded from the load-lock chamber 3 by the wafer transfer unit 11 and returned to the carrier 13a on the mounting table 13. In this manner, a series of manufacturing processes in the semiconductor device manufacturing apparatus 1 is completed.

The wafer W having the SiN film 104 of a desired film thickness in the semiconductor device manufacturing apparatus 1 passes through, e.g., a film forming apparatus, a CMP (Chemical Mechanical Polishing) apparatus or the like. As a result, a complete semiconductor device is produced.

In accordance with the semiconductor device manufacturing apparatus 1 of the above-described embodiment of the present invention, the SiNO film 105 on the surface of the SiN film 104 is turned into the reaction product film 105' which allows the etching gas can pss therethrough, so that the hydrogen fluoride gas 106 serving as an etching gas can uniformly reach the SiN film 104. Accordingly, the SiN film 104 can be effectively etched, and the throughput is improved.

Further, by performing the etching by using the hydrogen fluoride gas, the SiN film 104 having a desired thickness with less damage can be obtained, and a stress film for exerting a stress can be formed on a region on the surface of the wafer W where the transistors 103 are formed. Moreover, the hydrogen fluoride gas 106 can pass through the reaction product film 105' and uniformly reach the entire SiN film 104. Accordingly, the entire SiN film 104 can be uniformly etched, and the SiN film 104 having a uniform film thickness can be formed over the entire surface of the wafer W.

The etching rate can be made higher by performing the etching process in a state where the reaction product film 105' remains on the surface of the SiN film 104. Further, the throughput is considerably improved by performing a series of etching processes consecutively in the processing chamber 41 of the etching apparatus 5.

The above embodiment has described the case in which a single SiN film 104 (stress film) is formed. However, by using a resist pattern mask or the like, a dual stress liner technique may be realized by forming a SiN film having a tensile stress and a SiN film having a compressive stress over a region on the surface of the wafer W where the transistors 103 are formed.

While the invention has been shown and described with respect to the embodiments, it will be understood by those skilled in the art that various changes and modification may be made without departing from the scope of the invention as defined in the following claims.

In the above-described embodiment, the example, in which the hydrogen fluoride gas and the ammonia gas are simultaneously supplied into the processing chamber of the etching apparatus, has been described. However, the gas containing the basic gas may be first supplied into the processing chamber. When the processing chamber of the etching apparatus is forcibly exhausted after the completion of the etching process, a purge process may be performed by supplying Ar gas or the like into the processing chamber.

Types of gases supplied into the processing chamber are not limited to the hydrogen fluoride gas or the ammonia gas. A gas containing another halogen element or a gas containing another basic gas may also be used. In addition to the halogen element or the basic gas, an inert gas such as an argon gas, a nitrogen gas or the like or other gases may be supplied into the processing chamber.

The configuration of the semiconductor device manufacturing apparatus 1 is not limited to that described in the above embodiment. For example, the heating process on the wafer may be performed in the etching apparatus without separately providing the etching apparatus and the PHT processing apparatus. Further, a semiconductor device manufacturing apparatus may include a film forming apparatus in addition to an etching apparatus and a PHT processing apparatus. The structure of the substrate processed in the semiconductor device manufacturing apparatus 1 is not limited to that described in the above embodiment. The etching process performed in the semiconductor device manufacturing apparatus 1 is not limited to the formation of the stress film described in the embodiment. The present invention may be applied to etching of various portions.

A SiN film as an etching target in the semiconductor device manufacturing apparatus 1 is not limited to a CVD film and may be other types of SiN films. The CVD film formation may be performed by, e.g., a thermal CVD method, an atmospherical CVD method, a reduced pressure CVD method, a plasma CVD method or the like. Further, depending on the types of SiN films, the etching amount or the like can be controlled by adjusting a temperature of a wafer W, a partial pressure of the hydrogen fluoride gas, a partial pressure of the ammonia gas or the like in the etching process.

TEST EXAMPLE

Figures 9, 10:
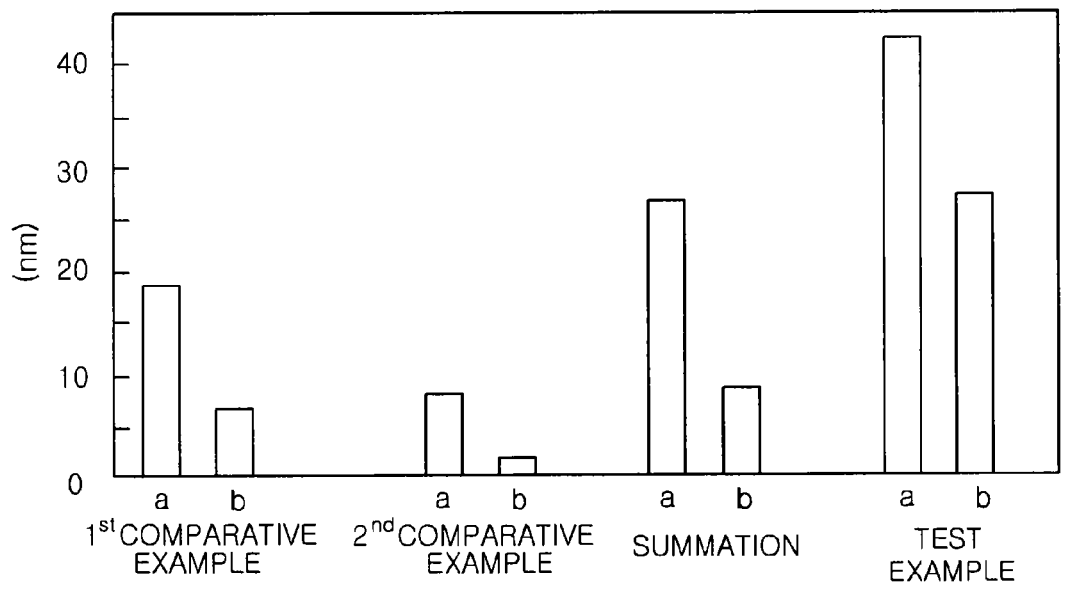
FIG. 9 is a table showing processing sequence of a test example of the present invention.
FIG. 10 is a graph for comparing an etching amount in a test example with those in a first and a second comparative example.

In a test example of the present invention, a SiN film formed on a surface of a wafer was etched by following steps 1 to 6. FIG. 9 is a table showing the steps 1 to 6 of the test example.

First, a wafer having a SiN film on a surface thereof was loaded into a processing chamber of an etching apparatus. Secondly, while a nitrogen gas of 1700 sccm and an argon gas of 300 sccm were supplied into the processing chamber, the pressure in the processing chamber was decreased to a low level of 3000 mT for two minutes (step 1). Next, while an ammonia gas of 160 sccm and an argon gas of 280 sccm were supplied into the processing chamber, the pressure in the processing chamber was decreased to a low level of 600 mT for 10 seconds (step 2). Then, while an ammonia gas of 160 sccm and a hydrogen fluoride gas of 160 sccm were supplied into the processing chamber, the pressure in the processing chamber was maintained to a low level of 600 mT for 10 seconds (step 3). Thereafter, while a nitrogen gas of 600 sccm and a hydrogen fluoride gas of 450 sccm were supplied into the processing chamber, the pressure in the processing chamber was maintained to a low level of 3000 mT for two minutes (step 4). Then, while a nitrogen gas of 1700 sccm and an argon gas of 300 sccm were supplied into the processing chamber, the processing chamber was exhausted to a vacuum level for five seconds (step 5). Further, the processing chamber was vacuum exhausted to maintain the pressure therein at the vacuum level for one minute without supplying a gas into the processing chamber (step 6).

Meanwhile, in a first comparative example, a SiN film formed on a surface of a wafer was etched by the above steps 1 to 3, 5 and 6. In a second comparative example, a SiN film is first subjected to the processes of the steps 1 to 3, 5 and 6 and the PHT treatment step (removal of the reaction product film), and then the SiN film remaining on a surface of a wafer thereafter was etched by the above steps 1, 2 and 4 to 6.

A SiN film 'a' formed by CVD while using hexachlorosilane as a film forming material and a SiN film 'b' formed by CVD while using dichlorosilane as a film forming material were prepared and subjected to the etching processes of the test example and the first and second comparative examples. Etching amounts (nm) by the respective etching processes are shown in FIG. 10.

The etching amount for the SiN film 'a' was about in a range from 10 nm to 20 nm, and the etching amount for the SiN film 'b' was about in a range from 1 nm to 6 nm in the first comparative example in which the etching process is performed by merely using a gaseous mixture of a hydrogen fluoride gas and an ammonia gas (step 3) and in the second comparative example in which the etching process is performed by merely using a hydrogen fluoride gas (step 4). On the other hand, in the test example in which the etching process is performed by using a gaseous mixture of a hydrogen fluoride gas and an ammonia gas first (step 3), and then the etching process is consecutively performed by using a hydrogen fluoride gas (step 4) at an initial stage of the etching process, the etching amount for the SiN film 'a' was about 40 nm or above, and the etching amount for the SiN film 'b' was about 20 nm or above.

When the etching process using the hydrogen fluoride gas (step 4) is consecutively performed after the etching process using the gaseous mixture of the hydrogen fluoride gas and the ammonia gas (step 3) at the initial stage of the etching process, it is expected that the etching amount corresponds to the sum of the etching amounts in the first and second comparative examples. However, in the test example in accordance with the embodiment of the present invention in which the steps 3 and 4 were consecutively executed, the etching amount was considerably higher than the sum of the etching amounts in the first and second comparative examples.

Industrial Applicability

The present invention can be applied to an etching process on an SiN film.

Explanation of Reference Symbols
W wafer
1 semiconductor device manufacturing apparatus
4 PHT processing apparatus
5 etching apparatus
8 control computer
40 chamber
41 processing chamber
101 gate electrode
102 sidewall
103 transistor
104 SiN film
105 film made of SiNO
105' film of reaction product
106 gas containing halogen element (hydrogen fluoride gas)

What is claimed is:

1. A method for manufacturing a semiconductor device by etching a SiN film on a surface of a substrate by using a gas containing a halogen element, the method comprising:
supplying the gas containing the halogen element to the surface of the SiN film,
wherein a gas containing a basic gas is supplied at an initial stage of said supplying the gas containing the halogen element.

2. The method of claim 1, wherein the surface of the SiN film is covered by a SiNO film, and the SiNO film is changed to a film of a reaction product by supplying a gaseous mixture including the gas containing the halogen element and the gas containing the basic gas onto the surface of the SiNO film.

3. The method of claim 2, wherein after the gas containing the basic gas stops being supplied, the SiN film is etched by the gas containing the halogen element in a state where the film of reaction product remains on the surface of the SiN film.

4. The method of claim 1, further comprising: heating the substrate after the SiN film on the surface of the substrate is etched by using the gas containing the halogen element.

5. The method of claim 4, wherein in the heating the substrate, temperature of the substrate is 90° C. or above.

6. The method of claim 1, wherein the gas containing the halogen element includes a hydrogen fluoride gas.

7. The method of claim 1, wherein the gas containing the basic gas includes an ammonia gas.

8. The method of claim 1, wherein the SiN film is a stress film for exerting a stress on a region on the surface of the substrate where transistors are formed.

9. An apparatus for manufacturing a semiconductor device by etching a SiN film formed on a surface of a substrate accommodated in a processing chamber, the apparatus comprising:
a gas supply mechanism configured to supply a gas containing a halogen element and a gas containing a basic gas into the processing chamber; and
a control unit configured to control the gas supply mechanism,
wherein, under the control of the control unit, the gas containing the basic gas is supplied at an initial stage of a process for supplying the gas containing the halogen element to the surface of the SiN film in the processing chamber.

* * * * *